US009450378B2

(12) United States Patent
Tanaka et al.

(10) Patent No.: US 9,450,378 B2
(45) Date of Patent: Sep. 20, 2016

(54) METHOD FOR CONTROLLING WAVELENGTH-TUNABLE LASER

(71) Applicant: Sumitomo Electric Device Innovations, Inc., Yokohama-shi (JP)

(72) Inventors: Hirokazu Tanaka, Yokohama (JP); Masao Shibata, Yokohama (JP); Mitsuyoshi Miyata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/847,979

(22) Filed: Sep. 8, 2015

(65) Prior Publication Data
US 2016/0079732 A1   Mar. 17, 2016

Related U.S. Application Data

(62) Division of application No. 14/447,214, filed on Jul. 30, 2014, now Pat. No. 9,160,141.

(30) Foreign Application Priority Data

Jul. 31, 2013   (JP) ................................. 2013-159800
Jan. 31, 2014   (JP) ................................. 2014-016908

(51) Int. Cl.
*H01S 3/13*      (2006.01)
*H01S 5/0687*   (2006.01)
(Continued)

(52) U.S. Cl.
CPC ............. *H01S 5/0687* (2013.01); *H01S 5/028* (2013.01); *H01S 5/02407* (2013.01); *H01S 5/02415* (2013.01); *H01S 5/02446* (2013.01); *H01S 5/0617* (2013.01); *H01S 5/06256* (2013.01); *H01S 5/06258* (2013.01);
(Continued)

(58) Field of Classification Search
CPC ............. H01S 5/0687; H01S 5/06258; H01S 5/06256; H01S 5/0612; H01S 5/1212; H01S 5/1209; H01S 5/02438; H01S 5/02407; H01S 5/02446
USPC ................. 372/32, 29.02, 36, 34, 29.011, 20
See application file for complete search history.

(56) References Cited

U.S. PATENT DOCUMENTS 6,400,737 B1    6/2002  Broutin et al.
2002/0051270 A1* 5/2002  Tatsuno ................ H01S 5/0687
                                                          398/192

(Continued)

FOREIGN PATENT DOCUMENTS

JP    2009-026996 A    2/2009

*Primary Examiner* — Kinam Park
(74) *Attorney, Agent, or Firm* — Venable LLP; Michael A. Sartori

(57) ABSTRACT

The method for controlling a wavelength-tunable laser comprises a first step of acquiring a driving condition of the wavelength-tunable laser for laser oscillation at a first wavelength, and a second step of calculating according to the driving condition of the first wavelength and a wavelength difference between the first wavelength and a second wavelength different from the first wavelength a control value or target value of a wavelength characteristic of the second wavelength in the wavelength detection unit, so as to calculate a driving condition for driving the wavelength-tunable laser, the second step including a step of selecting according to the wavelength difference one of etalon slopes having respective gradients identical and opposite to a gradient of an etalon slope used for controlling the first wavelength.

3 Claims, 11 Drawing Sheets

(51) Int. Cl.
*H01S 5/024* (2006.01)
*H01S 5/0625* (2006.01)
*H01S 5/12* (2006.01)
*H01S 5/343* (2006.01)
*H01S 5/026* (2006.01)
*H01S 5/028* (2006.01)
*H01S 5/06* (2006.01)
*H01S 5/068* (2006.01)

(52) U.S. Cl.
CPC .......... *H01S 5/1209* (2013.01); *H01S 5/1212* (2013.01); *H01S 5/34306* (2013.01); *H01S 5/0265* (2013.01); *H01S 5/0287* (2013.01); *H01S 5/02438* (2013.01); *H01S 5/0612* (2013.01); *H01S 5/06804* (2013.01)

(56) References Cited

U.S. PATENT DOCUMENTS

| | | |
|---|---|---|
| 2005/0030986 A1 | 2/2005 | Farrell et al. |
| 2009/0022186 A1* | 1/2009 | Tanaka ................. H01S 5/0612 372/20 |
| 2010/0034224 A1 | 2/2010 | Takabayashi et al. |

* cited by examiner

Fig. 5(a)

| Ch | Initial set value ||||||||| Feedback control target value ||| Temperature correction coefficient |
|---|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | | | $I_{m1}$ [μA] | $I_{m2}/I_{m1}$ A.U. | C1 [GHz/°C] |
| 1 | 150.00 | 67.39 | 52.508 | 40.000 | 29.42 | 57.47 | 50.69 | | | 315.0 | 1.175 | −1.800 |
| 3 | 150.00 | 47.74 | 34.533 | | 64.38 | 81.31 | 72.45 | | | 317.5 | | |
| 5 | 150.00 | 50.86 | 38.727 | | 59.05 | 77.71 | 69.12 | | | 313.0 | | |
| ... | ... | ... | ... | | ... | ... | ... | | | ... | | |
| n−1 | 150.00 | 54.77 | 54.046 | | 41.24 | 43.32 | 11.69 | | | 317.2 | | |

Fig. 5(b)

| Ch | Initial set value ||||||||| Feedback control target value ||| Temperature correction coefficient | Flag |
|---|---|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | | | $I_{m1}$ [μA] | $I_{m2}/I_{m1}$ A.U. | C1 [GHz/°C] | fundamental or middle |
| 1 | 150.00 | 67.39 | 52.508 | 40.000 | 29.42 | 57.47 | 50.69 | | | 315.0 | 1.175 | −1.800 | |

METHOD FOR CONTROLLING WAVELENGTH-TUNABLE LASER

CROSS REFERENCE TO RELATED APPLICATIONS

This application is a Divisional of U.S. patent application Ser. No. 14/447,214, filed Jul. 30, 2014, which claims the benefit of Japanese Patent Application Nos. 2013-159800, filed Jul. 31, 2013 and 2014-016908, filed Jan. 31, 2014.

BACKGROUND OF THE INVENTION

1. Field of the Invention

The present invention relates to a method for controlling a wavelength-tunable laser.

2. Related Background Art

Wavelength-tunable lasers which can select output wavelengths are disclosed (see, for example, Patent Literature 1). Such a wavelength-tunable laser is used for achieving an ITU-T grid, for example.

Patent Literature 1: Japanese Patent Application Laid-Open No. 2009-026996

SUMMARY OF THE INVENTION

For achieving the ITU-T grid and the like, an etalon having transmission intensities at a predetermined wavelength interval is used. For achieving the ITU-T grid with a wavelength spacing of 50 GHz, for example, an etalon having an FSR (free spectral range) of 50 GHz is needed together with ITU-T information with a spacing of 25 GHz. This necessitates an enormous amount of test time, thereby requiring a larger memory capacity as channel data increases.

It can be said that, in view of the problem mentioned above, for example, an object of the present invention is to provide a method for controlling a wavelength-tunable laser which can shorten the test time and suppress the memory capacity, for example.

The method for controlling a wavelength-tunable laser in accordance with one aspect of the present invention is a method for controlling a wavelength-tunable laser comprising a wavelength detection unit having an etalon, the method comprising a first step of acquiring a driving condition of the wavelength-tunable laser for laser oscillation at a first wavelength; a second step of calculating according to the driving condition of the first wavelength and a wavelength difference between the first wavelength and a second wavelength different from the first wavelength a control value or target value of a wavelength characteristic of the second wavelength in the wavelength detection unit, so as to calculate a driving condition for driving the wavelength-tunable laser; and a third step of feedback-controlling an oscillation wavelength according to a difference between a result of detection of a wavelength by the wavelength detection unit and the target value; the second step including a step of selecting according to the wavelength difference one of etalon slopes having respective gradients identical and opposite to a gradient of an etalon slope used for controlling the first wavelength. This method for controlling a wavelength-tunable laser in accordance with one aspect of the present invention can shorten the test time and suppress the memory capacity.

The etalon slope having a gradient identical to that of the etalon slope used for controlling the first wavelength may be selected when the wavelength difference is smaller than a quarter of an FSR of the etalon, while the etalon slope having a gradient opposite to that of the etalon slope used for controlling the first wavelength may be selected when the wavelength difference is at least a quarter of the FSR of the etalon. The wavelength difference may be determined by the following expressions (1) and (2) when smaller than a quarter of the FSR of the etalon and not, respectively:

$$\Delta F = F' - F \quad (1)$$

$$\Delta F = F' - (F - FSR/2) \quad (2)$$

where F is a fundamental channel, F' is a required wavelength, and $\Delta F$ is the wavelength difference.

Another method for controlling a wavelength-tunable laser in accordance with one aspect of the present invention is a method for controlling a wavelength-tunable laser comprising a wavelength detection unit for detecting a wavelength by using a slope of any of a plurality of wavelength characteristics of an etalon, in which fundamental wavelengths are set in the slope on one side of the plurality of wavelength characteristics of the etalon, when a required wavelength is any of the fundamental wavelengths, a slope having a gradient identical to that of the fundamental wavelength is used for wavelength control, while, when the required wavelength differs from the fundamental wavelength, a slope having a gradient opposite to that of the fundamental wavelength is used for the wavelength control. This method for controlling a wavelength-tunable laser in accordance with one aspect of the present invention can shorten the test time and suppress the memory capacity.

Still another method for controlling a wavelength-tunable laser in accordance with one aspect of the present invention is a method for controlling a wavelength-tunable laser comprising a wavelength detection unit having an etalon, the method comprising a first step of acquiring from a memory a first driving condition for laser-oscillating the wavelength-tunable laser at a first wavelength; a second step of computing a second driving condition for oscillating the wavelength-tunable laser at a second wavelength with reference to the first driving condition and a wavelength difference between the first and second wavelengths; and a third step of detecting with the wavelength detection unit an output wavelength of the wavelength-tunable laser driven according to the second driving condition and performing according to a result thereof feedback control for correcting the driving conditions of the wavelength-tunable laser; the method further comprising a step, before the third step, of determining whether or not to reverse a correction sign for the correction in the feedback control with respect to a correction sign in the first driving condition. This method for controlling a wavelength-tunable laser in accordance with one aspect of the present invention can shorten the test time and suppress the memory capacity.

The correction sign may be reversed and not when the wavelength difference is at least a quarter of an FSR of the etalon and not, respectively. The wavelength difference may be determined by the following expressions (1) and (2) when smaller than a quarter of the FSR of the etalon and not, respectively:

$$\Delta F = F' - F \quad (1)$$

$$\Delta F = F' - (F - FSR/2) \quad (2)$$

where F is a fundamental channel, F' is a required wavelength, and $\Delta F$ is the wavelength difference.

Yet another method for controlling a wavelength-tunable laser in accordance with one aspect of the present invention is a method for controlling a wavelength-tunable laser comprising a wavelength detection unit having an etalon with such a wavelength characteristic that signs of gradients of slopes reverse alternately, in which fundamental wavelengths are set in wavelength regions in one sign of the slopes, when one of the fundamental wavelengths is required, a driving condition for laser-oscillating the wavelength-tunable laser at the wavelength is acquired from a memory, an output wavelength of the wavelength-tunable laser driven according to the driving condition is detected by the wavelength detection unit, and according to a result thereof, feedback control for correcting the driving condition of the wavelength-tunable laser is performed, and when a wavelength in a wavelength region in the other sign of the slopes is required, a correction sign for the correction in the feedback control is reversed from the correction sign in the driving condition. This method for controlling a wavelength-tunable laser in accordance with one aspect of the present invention can shorten the test time and suppress the memory capacity.

The methods for correcting a wavelength of a wavelength-tunable laser in accordance with one aspect of the present invention can shorten the test time and suppress the memory capacity, for example.

BRIEF DESCRIPTION OF THE DRAWINGS

FIG. 5($a$) is a chart illustrating initial set values and feedback control target values, while FIG. 5($b$) is a chart illustrating updated set values to be stored in a RAM;

DESCRIPTION OF THE PREFERRED EMBODIMENTS

The FSR (free spectral range) of an etalon will be explained before embodiments. For oscillating a wavelength-tunable laser at a given wavelength, AFC (Automatic Frequency Control) using an etalon is performed. Gridless control for setting a given wavelength can control an oscillation wavelength by changing the temperature of the etalon.

Since the gridless control uses a temperature change to alter the wavelength characteristic of an etalon, so as to obtain a desirable wavelength characteristic, an etalon for gridless control is desired to alter its wavelength characteristic greatly upon a temperature change. In view of accuracy in wavelength adjustment and the like, it is preferred for the gridless control etalon to suppress its width of wavelength change with respect to temperature to about 15 pm/° C.

Preferably, however, the gridless control etalon can achieve a 50-GHz spacing when using slopes on both sides at FSR=100 GHz, for example, while supporting ±35 GHz per channel in gridless control and fine-tuned control. This means that a temperature range of about 38° C. is necessary when an etalon for grid control is used. Problems such as an increase in power consumption occur when a support at an ambient temperature of 80° C. during use is taken into consideration.

For overcoming such problems, the width of wavelength change with respect to temperature may be suppressed to 15 pm/° C., while using slopes on both sides of the grid control etalon at FSR=50 GHz, so as to achieve a 25-GHz spacing, and making a gridless range per channel of ±12.5 GHz can yield a temperature range of about 14° C. While an etalon in which FSR=25 GHz may be used, one in which FSR=50 GHz is used preferably when packaging is taken into consideration. This is because the etalon doubles its size when FSR is ½.

Figure 1:
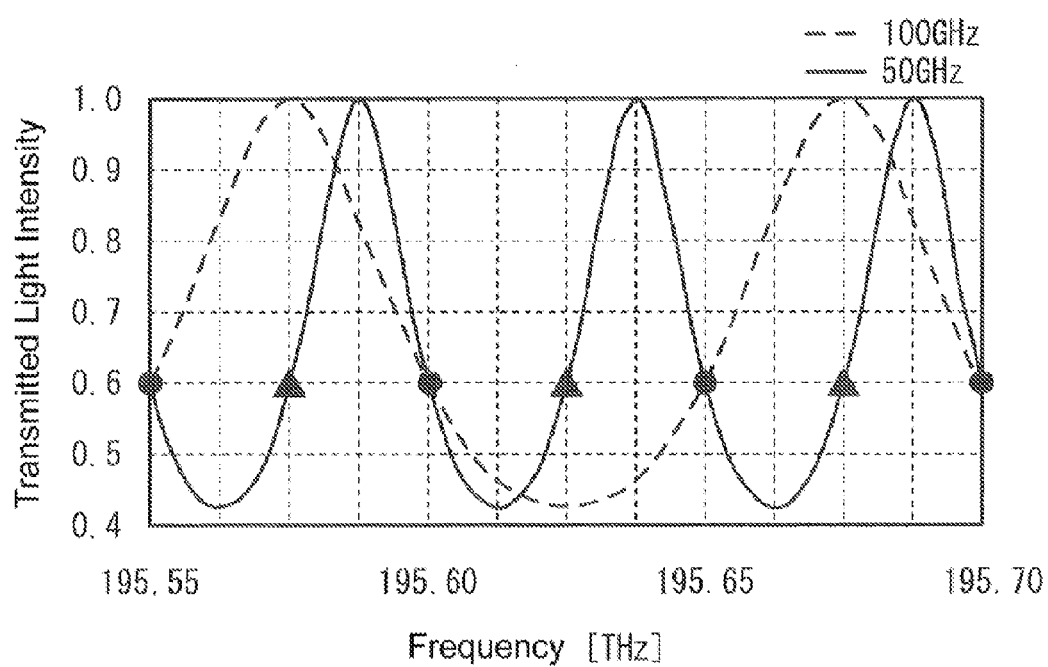
FIG. 1 is a chart illustrating characteristics of an etalon.

FIG. 1 is a chart illustrating etalon characteristics when FSR=100 GHz and 50 GHz. Tests have conventionally been conducted at intervals of 50 GHz (black circles) in slopes on both sides of FSR=100 GHz. When tests are conducted at intervals of 25 GHz in slopes on both sides of FSR=50 GHz, the test time must double, and so does the channel data in an iTLA (integrable tunable laser assembly), thereby requiring a large capacity of memory. Therefore, a method for controlling a wavelength-tunable laser which can shorten the test time and suppress the memory capacity will be explained in the following embodiments.

First Embodiment

Figure 2:
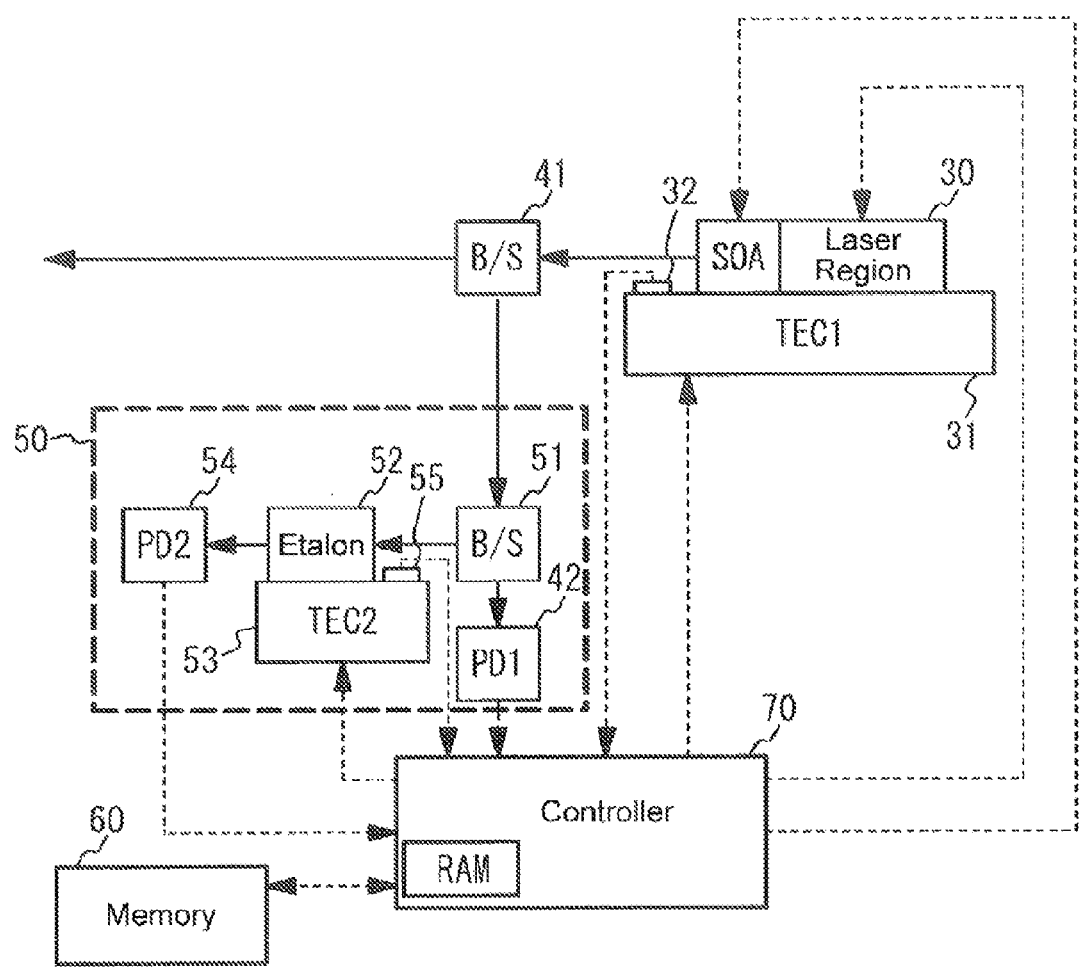
FIG. 2 is a block diagram illustrating an overall structure of a laser device in accordance with a first embodiment.

FIG. 2 is a block diagram illustrating an overall structure of a wavelength-tunable laser 100 in accordance with the first embodiment. As illustrated in FIG. 2, the wavelength-tunable laser 100 comprises, as a laser device, a semiconductor laser 30 (tunable semiconductor laser) which can control its wavelength. The semiconductor laser 30 in this embodiment is provided with a region to become an SOA (Semiconductor Optical Amplifier) by coupling with a laser region. The SOA functions as an optical output control unit. The SOA can arbitrarily increase and decrease the intensity of optical output. The SOA can also control the intensity of optical output so that it becomes substantially zero. The wavelength-tunable laser 100 further comprises an output detection unit 40, a wavelength locker unit 50, a memory 60, a controller 70, and the like. The controller 70 controls the wavelength-tunable laser 100 and has a RAM (Random Access Memory) therewithin.

Figure 3:
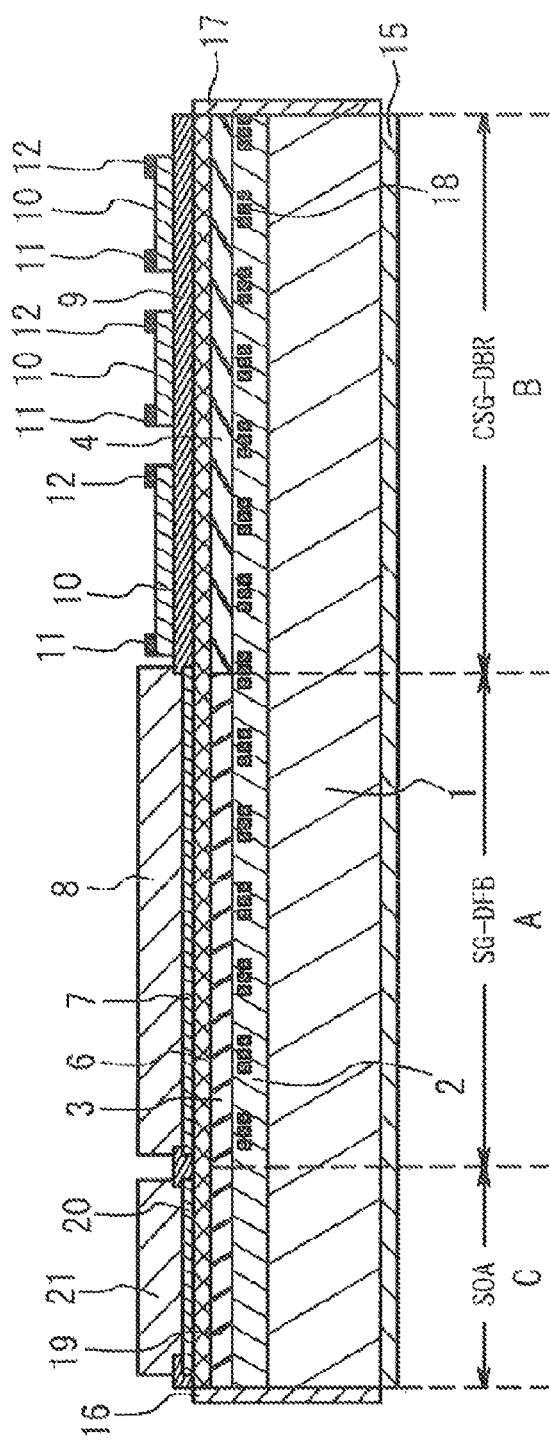
FIG. 3 is a schematic sectional view illustrating an overall structure of a semiconductor laser.

FIG. 3 is a schematic sectional view illustrating an overall structure of the semiconductor laser 30 in this embodiment. As illustrated in FIG. 3, the semiconductor laser 30 comprises an SG-DFB (Sampled Grating Distributed Feedback) region A, a CSG-DBR (Chirped Sampled Grating Distributed Bragg Reflector) region B, and an SOA (Semiconductor Optical Amplifier) region C. That is, the semiconductor laser 30 is a laser having a wavelength-selective mirror within a semiconductor structure.

For example, the SOA region C, SG-DFB region A, and CSG-DBR region B are arranged in this order from the front side to the rear side in the semiconductor laser 30. The SG-DFB region A has a gain and is equipped with a sampled grating. The CSG-DBR region B has no gain and is equipped with a sampled grating. The SG-DFB region A and CSG-DBR region B correspond to the laser region in FIG. 2, while the SOA region C corresponds to the SOA region in FIG. 2.

The SG-DFB region A has a structure in which a lower cladding layer 2, an active layer 3, an upper cladding layer 6, a contact layer 7, and an electrode 8 are stacked on a substrate 1. The CSG-DBR region B has a structure in which the lower cladding layer 2, an optical waveguide layer 4, the upper cladding layer 6, an insulating film 9, and a plurality of heaters 10 are stacked on the substrate 1. Each heater 10 is provided with a power supply electrode 11 and a ground electrode 12. The SOA region C has a structure in which the lower cladding layer 2, an optical amplification layer 19, the upper cladding layer 6, a contact layer 20, and an electrode 21 are stacked on the substrate 1.

Each of the substrate 1, lower cladding layer 2, and upper cladding layer 6 is integrally formed in the SG-DFB region A, CSG-DBR region B, and SOA region C. The active layer 3, optical waveguide layer 4, and optical amplification layer 19 are formed on the same plane. The boundary between the SG-DFB region A and CSG-DBR region B corresponds to that between the active layer 3 and optical waveguide layer 4.

An end face film 16 is formed on an end face on the SOA region C side of the substrate 1, lower cladding layer 2, optical amplification layer 19, and upper cladding layer 6. In this embodiment, the end face film 16 is an AR (Anti Reflection) film. The end face film 16 functions as a front-side end face of the semiconductor laser 30. An end face film 17 is formed on an end face on the CSG-DBR region B side of the substrate 1, lower cladding layer 2, optical waveguide layer 4, and upper cladding layer 6. In this embodiment, the end face film 17 is an AR film. The end face film 17 functions as a rear-side end face of the semiconductor laser 30.

The substrate 1 is a crystal substrate made of n-type InP, for example. The lower and upper cladding layers 2, 6 are of n and p types, respectively, each constituted by InP, for example. The lower and upper cladding layers 2, 6 optically confine the active layer 3, optical waveguide layer 4, and optical amplification layer 19 therebetween from the lower and upper sides.

The active layer 3 is constituted by a semiconductor having a gain. For example, the active layer 3 has a quantum well structure in which well layers made of $Ga_{0.32}/In_{0.68}As_{0.92}P_{0.08}$ (each having a thickness of 5 nm) and barrier layers made of $Ga_{0.22}/In_{0.78}As_{0.47}P_{0.53}$ (each having a thickness of 10 nm) are stacked alternately. For example, the optical waveguide layer 4 can be constructed by a bulk semiconductor layer such as $Ga_{0.22}/In_{0.78}As_{0.47}P_{0.53}$. In this embodiment, the optical waveguide layer 4 has an energy gap greater than that of the active layer 3.

The optical amplification layer 19 is a region which acquires a gain when a current is injected from the electrode 21, thereby achieving optical amplification. For example, the amplification layer 19 may be constructed by a quantum well structure in which well layers made of $Ga_{0.35}In_{0.65}As_{0.99}P_{0.01}$ (each having a thickness of 5 nm) and barrier layers made of $Ga_{0.15}In_{0.85}As_{0.32}P_{0.66}$ (each having a thickness of 10 nm) are stacked alternately. As another structure, a bulk semiconductor made of $Ga_{0.44}In_{0.56}As_{0.95}P_{0.05}$ may be employed, for example. The optical amplification layer 19 and the active layer 3 may be constituted by the same material.

The contact layers 7, 20 may be constituted by a p-type $Ga_{0.47}In_{0.53}As$ crystal, for example. The insulating film 9 is a protective film made of silicon nitride (SiN) or silicon oxide (SiO). The heaters 10 are thin-film resistive elements constituted by titanium tungsten (TiW). Each heater 10 may be formed over a plurality of segments of the CSG-DBR region B.

The electrodes 8, 21, power supply electrode 11, and ground electrode 12 are made of a conductive material such as gold (Au). A rear electrode 15 is formed on the lower side of the substrate 1. The rear electrode 15 is formed over the SG-DFB region A, CSG-DBR region B, and SOA region C.

Each of the end face films 16, 17 is an AR film having a reflectance of 1.0% or lower, thus yielding such a characteristic that its end face exhibits substantially no reflection. The AR film may be constituted by a dielectric film made of $MgF_2$ and TiON, for example. While both ends of the laser are AR films in this embodiment, the end face film 17 may be constituted by a reflective film having a significant reflectance. When a semiconductor in contact with the end face film 17 in FIG. 3 is provided with a light absorption layer, the end face film 17 having a significant reflectance can restrain optical output from leaking out from the end face film 17. An example of the significant reflectance is 10% or greater. Here, the reflectance means one with respect to the inside of the semiconductor laser.

Diffraction gratings (corrugations) 18 are formed at a plurality of locations at predetermined intervals in the lower cladding layer 2 of the SG-DFB region A and CSG-DBR region B. This forms sampled gratings in the SG-DFB region A and CSG-DBR region B. A plurality of segments are formed in the lower cladding layer 2 in the SG-DFB region A and CSG-DBR region B. Here, the segment is a region where a diffraction grating part provided with the diffraction grating 18 and a space part free of the diffraction grating 18 alternately continue with each other. That is, the segment is a region where the diffraction grating part and the space part held between the diffraction grating parts at both ends are connected to each other. The diffraction gratings 18 are constituted by a material having a refractive index different from that of the lower cladding layer 2. When the lower cladding layer 2 is InP, $Ga_{0.22}/In_{0.78}As_{0.47}P_{0.53}$ may be used as a material constituting the diffraction gratings, for example.

The diffraction gratings 18 may be formed by patterning using a two-beam interference exposure method. The space part located between the diffraction gratings 18 may be attained by exposing a resist to light through a pattern of the diffraction grating 18 and then exposing a position corresponding to the space part again to light. The pitch of the diffraction gratings 18 in the SG-DFB region A and that in the CSG-DBR region B may be identical to or different from each other. By way of example, both pitches are set identical to each other in this embodiment. In each segment, the diffraction gratings 18 may have lengths identical to or different from each other. The diffraction gratings 18 in the SG-DFB region A may have the same length, the diffraction gratings 18 in the CSG-DBR region B may have the same length, and the length of the diffraction gratings 18 in the SG-DFB region A may be different from that in the CSG-DBR region B.

The segments in the SG-DFB region A have substantially the same optical length. At least two segments in the CSG-DBR region B are formed such as to have optical lengths different from each other. As a consequence, intensities of peaks in the wavelength characteristic of the CSG-DBR region B depend on their wavelengths. The average optical length of the segments in the SG-DFB region A and that in the CSG-DBR region B differ from each other. Thus, the segments in the SG-DFB region A and those in the CSG-DBR region B construct a resonator within the semiconductor laser 30.

Reflected light beams interfere with each other within each of the SG-DFB region A and the CSG-DBR region B. The SG-DFB region A, which is provided with the active layer 3, produces a discrete gain spectrum having substantially the same intensity at a predetermined wavelength interval when carriers are injected therein. The CSG-DBR region B produces a discrete gain spectrum having intensities different from each other at a predetermined wavelength interval. The interval between the peak wavelengths in the SG-DFB region A differs from that in the CSG-DBR region B. A vernier effect generated by a combination of these wavelength characteristics may be utilized, so as to select a wavelength which satisfies an oscillation condition.

As illustrated in FIG. 2, the semiconductor laser 30 is arranged on a first temperature control device 31. The first temperature control device 31 includes a Peltier element and functions as a TEC (thermoelectric cooler). A first thermistor 32 is arranged on the first temperature control device 31. The first thermistor 32 detects the temperature of the first temperature control device 31. According to the temperature detected by the first thermistor 32, the temperature of the semiconductor laser 30 can be specified.

The wavelength-tunable laser 100, in which the wavelength locker unit 50 is arranged on the front side of the semiconductor laser 30, can be called a front locker type. The wavelength locker unit 50 comprises a first light-receiving element 42, a beam splitter 51, an etalon 52, a second temperature control device 53, a second light-receiving element 54, and a second thermistor 55.

The beam splitter 41 is arranged at a position where output light from the front side of the semiconductor laser 30 is split. The beam splitter 51 is arranged at a position where light from the beam splitter 41 is split. The first light-receiving element 42 is arranged at a position where one of two beams of light split by the beam splitter 51 is received. The etalon 52 is arranged at such a position as to transmit therethrough the other of the two beams of light split by the beam splitter 51. The second light-receiving element 54 is arranged at a position where the light transmitted through the etalon 52 is received.

The etalon 52 has such a characteristic as to change its transmittance periodically depending on the wavelength of light incident thereon. A solid etalon is used as the etalon 52 in this embodiment. The periodic wavelength characteristic of the solid etalon changes with temperature. The etalon 52 is arranged at such a position as to transmit therethrough the other of the two beams of light split by the beam splitter 51. The etalon 52 is arranged on the second temperature control device 53. The second temperature control device 53 includes a Peltier element and functions as a TEC (thermoelectric cooler).

The second light-receiving element 54 is arranged at such a position as to transmit therethrough light transmitted through the etalon 52. The second thermistor 55 is provided in order to specify the temperature of the etalon 52. The second thermistor 55 is arranged on the second temperature control device 53, for example. In this embodiment, the second thermistor 55 detects the temperature of the second temperature control device 53, thereby specifying the temperature of the etalon 52.

The memory 60 is a rewritable memory device. A typical example of the rewritable memory device is a flash memory. The controller 70 comprises a central processing unit (CPU), a RAM (Random Access Memory), a power supply, and the like. The RAM is a memory for temporarily storing programs executed by the central processing unit, data processed thereby, and the like.

The memory 60 stores initial values and feedback control target values of individual parts of the wavelength-tunable laser 100 in association with channels. The channels are numbers corresponding to oscillation wavelengths of the semiconductor laser 30. For example, the channels correspond to grids of ITU-T (International Telecommunication Union Telecommunication Standardization Sector).

Here, fundamental wavelengths correspond to every other channels, e.g., 1, 3, 5, . . . , n−1. Middle wavelengths represent wavelengths each falling between two fundamental wavelengths adjacent to each other, e.g., 2, 4, 6, . . . , n. Odd-numbered channels are assumed to be fundamental wavelengths in this embodiment. The memory 60 stores the initial set values and feedback control target values of the fundamental wavelength channels.

Figure 4:
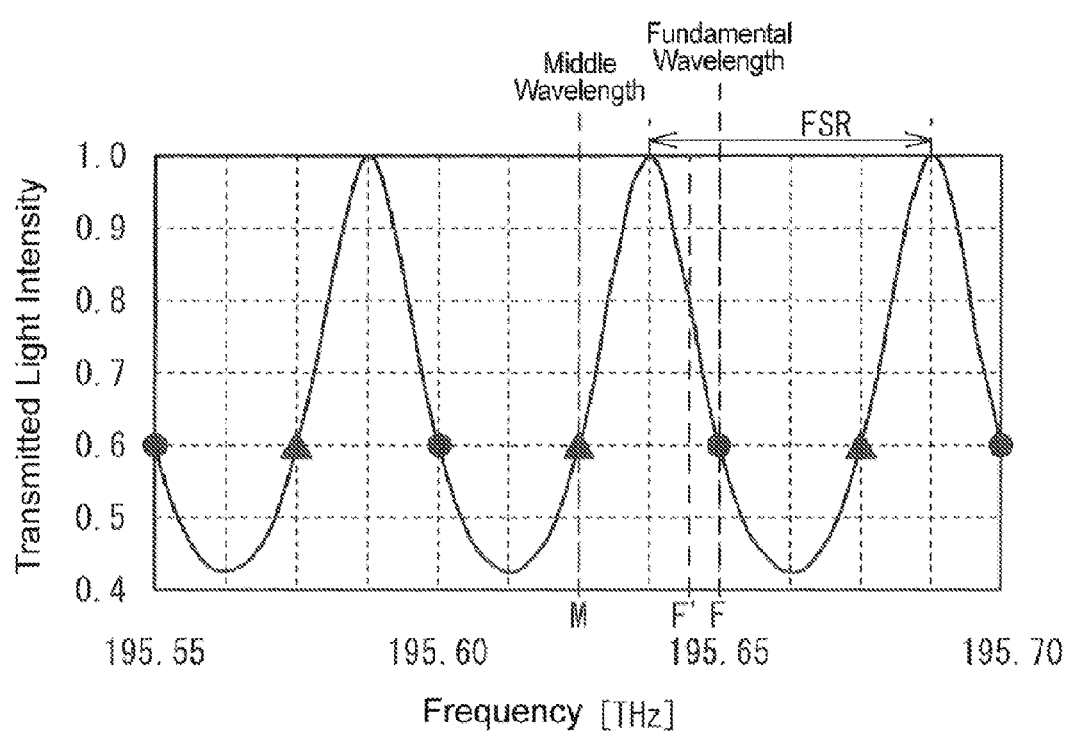
FIG. 4 is a chart illustrating fundamental wavelengths and middle wavelengths.

FIG. 4 is a chart illustrating the fundamental wavelengths and middle wavelengths. The abscissa and ordinate in FIG. 4 indicate the input wavelength (frequency) to the etalon 52 and the transmittance of the etalon 52, respectively. As illustrated in FIG. 4, the transmittance of the etalon 52 periodically changes with the wavelength. The fundamental channels and middle channels are set in the middle of respective slopes of the transmission characteristic of the etalon 52 with reference to FIG. 4. A slope of the transmission characteristic of the etalon 52 is a curve connecting the lowest point (bottom) and highest point (peak) of the transmission intensity. A frequency (wavelength) in the middle between the frequency of the peak having the highest transmission intensity and the frequency of the bottom having the lowest transmission intensity on the higher frequency side of the peak frequency is set as a fundamental wavelength F in this embodiment. That is, the fundamental wavelengths are set in the slopes on the right side (higher frequency side of the peaks). A frequency (wavelength) in the middle between the frequency of the bottom having the lowest transmission intensity and the frequency of the peak having the highest transmission intensity on the higher frequency side of the bottom frequency is set as a middle wavelength M. The middle wavelengths are set in the slopes on the left side (lower frequency side of the peaks) in this embodiment. The transmittance of the etalon at the fundamental wavelengths and that at the middle wavelengths are set to the same value. The support range of the fundamental wavelength F, which is explained as a range from the bottom of the slope in which the fundamental wavelength F exists to the bottom of the slope in which the middle wavelength M exists, may be a range between the middle wavelengths M adjacent to the fundamental wavelength F. Each of the ranges mentioned above coincides with the FSR (free spectral range) of the etalon 52.

FIG. 5(a) is a chart illustrating the above-mentioned initial set values and feedback control target values. As illustrated in FIG. 5(a), the initial set values include an initial current value $I_{LD}$ fed to the electrode 8 in the SG-DFB region A, an initial current value $I_{SOA}$ fed to the electrode 21 of the SOA region C, an initial temperature value $T_{LD}$ of the semiconductor laser 30, an initial temperature value $T_{Etalon}$ of the etalon 52, and initial power values $P_{Heater1}$ to $P_{Heater3}$ fed to the respective heaters 10. These initial set values are determined for each channel corresponding to the fundamental wavelength. The above-mentioned feedback control target values are target values for feedback-controlling the controller 70. The feedback control target values include a target value $I_{m1}$ of a photocurrent outputted from the first light-receiving element 42 and a target value $I_{m2}/I_{m1}$ of the ratio of a photocurrent $I_{m2}$ outputted from the second light-receiving element 54 to the photocurrent $I_{m1}$ outputted from the first light-receiving element 42. The control target values are also determined for each channel corresponding to the fundamental wavelength. The memory 60 also stores a temperature correction coefficient C1. The temperature correction coefficient C1 will be explained later in detail. In this embodiment, the temperature correction coefficient C1 is a value which is common among the channels. These values are acquired by tuning with a wavelength meter for each wavelength-tunable laser 100 before its shipment.

Operations of the wavelength-tunable laser 100 for outputting a required wavelength will now be explained. First, the controller 70 acquires information indicating the required wavelength from outside. According to the information indicating the required wavelength, the controller 70 selects the fundamental wavelength closest to the required wavelength from the memory 60. Then, the controller 70 reads the initial set values and feedback control target values of the channel corresponding to the selected fundamental wavelength as updated set values into its built-in RAM. FIG. 5(b) illustrates updated set values read into the RAM. The updated set values include a flag indicating a fundamental or middle wavelength. A procedure of setting the flag indicating the fundamental or middle wavelength will be explained later.

Next, the controller 70 feeds the electrode 8 of the semiconductor laser 30 with a current corresponding to the initial current value $I_{LD}$. The controller 70 also supplies the first temperature control device 31 with such a power as to attain the initial temperature value $T_{LD}$. This controls the temperature of the semiconductor laser 30 such that it becomes the initial value. The controller 70 further feeds the heaters 10 with the respective initial power values $P_{Heater1}$ to $P_{Heater3}$ corresponding to the channel. According to each of thus set initial values, the semiconductor laser 30 performs laser oscillation. However, it cannot guarantee that the fundamental wavelength and the oscillation wavelength coincide with each other. Therefore, the wavelength and output light intensity control are feedback-controlled.

For such feedback control, the controller 70 performs auto power control (APC) and auto frequency control (AFC). Specifically, as the auto power control, the controller 70 feedback-controls the current $I_{SOA}$ fed to the electrode 21 of the SOA region C such that the photocurrent value outputted from the first light-receiving element 42 becomes the target value $I_{m1}$ corresponding to the channel. This controls the output light intensity of the semiconductor laser 30 such that it becomes a desirable value.

As the auto frequency control, the controller 70 controls the temperature of the semiconductor laser 30 such that the ratio $I_{m2}/I_{m1}$ of the photocurrent of the photocurrent $I_{m2}$ outputted from the second light-receiving element 54 to the photocurrent $I_{m1}$ outputted from the first light-receiving element 42 becomes the target value $I_{m2}/I_{m1}$. This controls the output light wavelength of the semiconductor laser 30 such that it becomes the fundamental wavelength. When the flag indicating the middle wavelength is set, the slope on the side opposite to the fundamental wavelength is used. The controller 70 controls the driving power of the second temperature control device 53 so as to attain the initial temperature value $T_{Etalon}$ corresponding to the fundamental wavelength. The power fed to the second temperature control device 53 is feedback-controlled according to the result of detection by the second thermistor 55, whereby the temperature of the etalon 52 is regulated so as to become a predetermined value.

Figure 6:
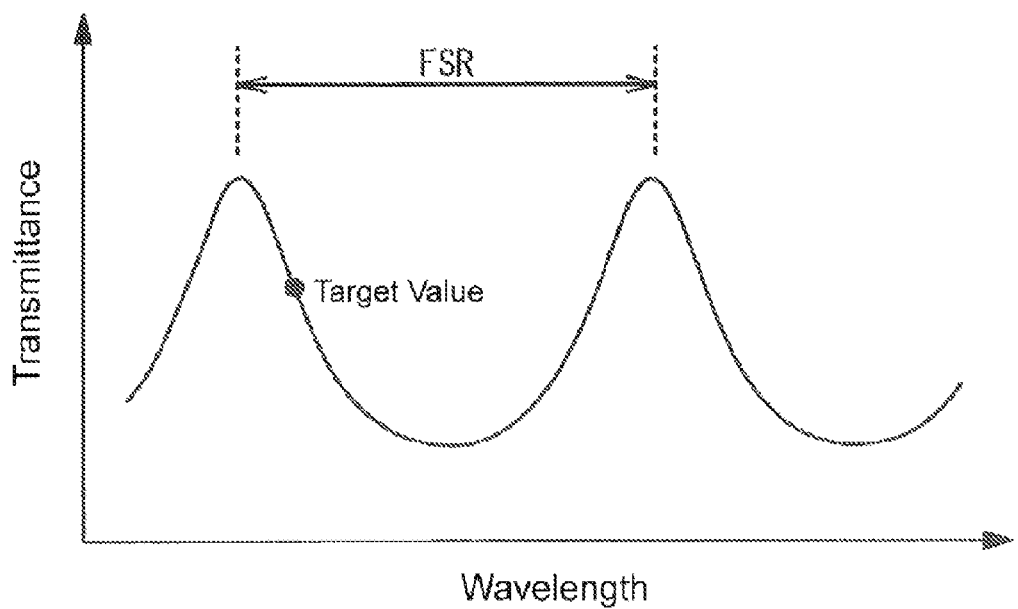
FIG. 6 is a chart illustrating a principle of a wavelength control method.

A principle of wavelength control using the ratio $I_{m2}/I_{m1}$ will now be explained. Since the etalon 52 has a characteristic illustrated in FIG. 6, the wavelength of light inputted to the etalon 52 can be specified from the ratio between the light intensities inputted to and outputted from the etalon 52. The light intensity inputted to the etalon 52 is represented by the photocurrent $I_{m1}$ outputted from the first light-receiving element 42. The light intensity outputted from the etalon 52 is represented by the photocurrent $I_{m2}$ outputted from the second light-receiving element 54. Therefore, the wavelength of light inputted to the etalon 52 can be specified by the ratio $I_{m2}/I_{m1}$. Hence, when parameters of the semiconductor laser 30 are feedback-controlled while using the ratio $I_{m2}/I_{m1}$ as a target value for wavelength control, a desirable wavelength output is attained. The semiconductor laser 30 of this embodiment controls the temperature of the first temperature control device 31 as a wavelength parameter.

Subsequently, the controller 70 calculates the initial set values or feedback control target values according to the difference between the required wavelength and the fundamental wavelength. In this embodiment, the above-mentioned fundamental and required wavelengths may be referred to as first and second wavelengths, respectively. Among the initial set values of the selected fundamental wavelength, this embodiment corrects the target value $T_{Etalon}$ of the second temperature control device 53 by calculation, thereby oscillating the semiconductor laser 30 at the required wavelength different from the fundamental wavelength.

Figure 7:
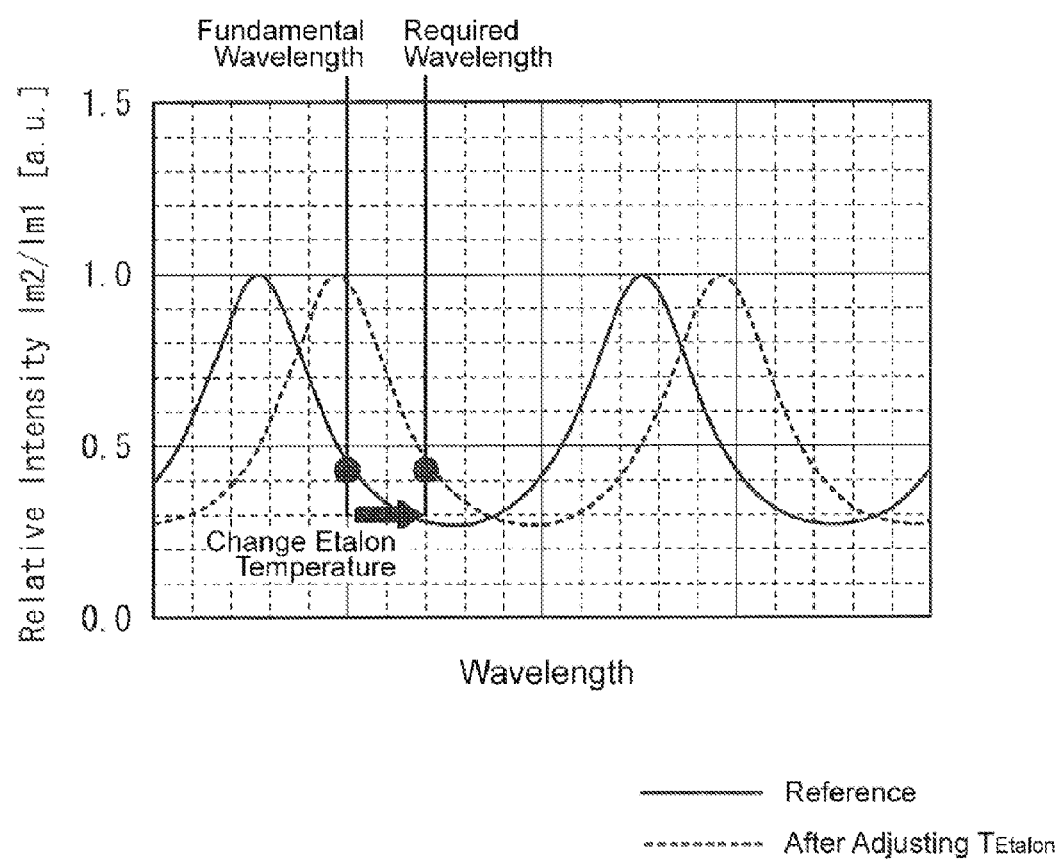
FIG. 7 is a chart illustrating the principle of the wavelength control method.

FIG. 7 is a chart illustrating a principle of a wavelength control method in accordance with this embodiment. The abscissa and ordinate in FIG. 7 indicate the wavelength and normalized ratio $I_{m2}/I_{m1}$ (transmittance of the etalon 52), respectively. The solid line in FIG. 7 is a wavelength characteristic of the etalon 52 corresponding to the initial temperature value $T_{Etalon}$. The dotted line is a wavelength characteristic of the etalon 52 when its temperature is raised by the second temperature control device 53. Supposing that the ratio $I_{m2}/I_{m1}$ at the black circle on the solid line is employed as a feedback target value, oscillation will occur at the fundamental wavelength if the etalon 52 is at the initial temperature value $T_{Etalon}$. If the etalon 52 is at a temperature corresponding to the wavelength characteristic indicated by the dotted line, on the other hand, the actual oscillation wavelength will shift from the fundamental wavelength by the amount of change in the etalon characteristic even when the ratio $I_{m2}/I_{m1}$ is at a value (the black circle on the dotted line) for obtaining the fundamental wavelength. That is, shifting the etalon characteristic by the wavelength difference between the required wavelength and fundamental wavelength can attain the required wavelength without changing the ratio $I_{m2}/I_{m1}$ as the feedback target value. Hence, according to the wavelength difference ΔF between the required wavelength and the fundamental wavelength, this embodiment performs a calculation for changing the etalon temperature and employs the changed temperature as the etalon temperature, thereby attaining the required wavelength.

As mentioned above, the wavelength characteristic of the etalon 52 shifts with its temperature. The amount of change in frequency/amount of change in temperature [GHz/° C.] in the etalon 52 will be referred to as temperature correction coefficient C1 of the etalon 52. Here, the wavelength is expressed in terms of frequency. The temperature correction coefficient C1 corresponds to the rate of change in the driving condition of the wavelength-tunable laser.

Let Tetln_A [° C.] be the set temperature of the etalon 52 for achieving the control for the required wavelength. Let Tetln_B [° C.] be the initial temperature of the etalon 52, i.e., the temperature of the etalon 52 corresponding to the selected fundamental wavelength. Tetln_B corresponds to $T_{Etalon}$ and is acquired from the memory 60. Let ΔF [GHz] be the wavelength difference (in absolute value) between the fundamental and required wavelengths. In this case, the relationship between the parameters can be represented by the following expression (1). The set temperature Tetln_A necessary for obtaining the required wavelength can be determined according to the expression (1).

$$Tetln\_A = Tetln\_B + \Delta F/C1. \quad (1)$$

Controlling the temperature of the second temperature control device 53 so as to make it become the set temperature Tetln_A can obtain the required wavelength while utilizing the ratio $I_{m2}/I_{m1}$ as it is.

A specific example will now be represented. A calculation is performed so as to determine the difference between the required wavelength and the start grid wavelength, divide the difference by the grid interval wavelength, and employ the integer part of the result as a channel number Ch. Among the initial set values corresponding to thus obtained channel number Ch, the controller 70 acquires the etalon temperature $T_{Etalon}$ as the etalon temperature Tetln_B. Here, Tetln_B is assumed to be 40.000 [° C.]. As the fundamental wavelength, the controller 70 determines the grid wavelength corresponding to the channel number Ch obtained by the calculation and computes the difference (wavelength difference ΔF) between the fundamental and required wavelengths. A typical calculation for obtaining the fundamental wavelength is executed by adding to the start grid wavelength the product of the value obtained as the channel number Ch by the grid interval wavelength. Here, the fundamental wavelength is 196.1000 [THz]. Calculating the difference between the required wavelength and thus obtained fundamental wavelength can yield the wavelength difference ΔF. Here, the wavelength difference ΔF obtained by the calculation is +7.0 [GHz].

The controller 70 refers to the temperature correction coefficient C1 from the memory 60. The temperature correction coefficient C1 is determined by the characteristic of the etalon 52 and typically recorded beforehand in the memory 60. Here, the temperature correction coefficient C1 is assumed to be −1.800 [GHz/° C.]. Subsequently, the controller 70 calculates Tetln_A by using the expression (1). Thus calculated Tetln_A becomes 36.111 [° C.].

Next, the controller 70 controls the wavelength-tunable laser 100 while the temperature of the etalon 52 is fixed at Tetln_A. This shifts the wavelength characteristic of the etalon 52. For achieving this, it is necessary for the temperature of the etalon 52 to be variable.

In this control, the controller 70 controls the wavelength of the semiconductor laser 30 such as to attain the ratio $I_{m2}/I_{m1}$, which is the feedback target value, while the temperature of the etalon 52 is fixed at Tetln_A. The feedback target value ($I_{m2}/I_{m1}$) employed here is the feedback target value given to the channel number Ch corresponding to the fundamental wavelength. The initial set values given to the channel number Ch corresponding to the fundamental wavelength are also employed for the other set values provided for the individual parts of the wavelength-tunable laser 100.

Executing the foregoing operations allows the semiconductor laser 30 to perform laser oscillation at a wavelength (required wavelength) shifted from the fundamental wavelength by the amount of shift in the characteristic of the etalon 52 as illustrated in FIG. 7.

Figure 8:
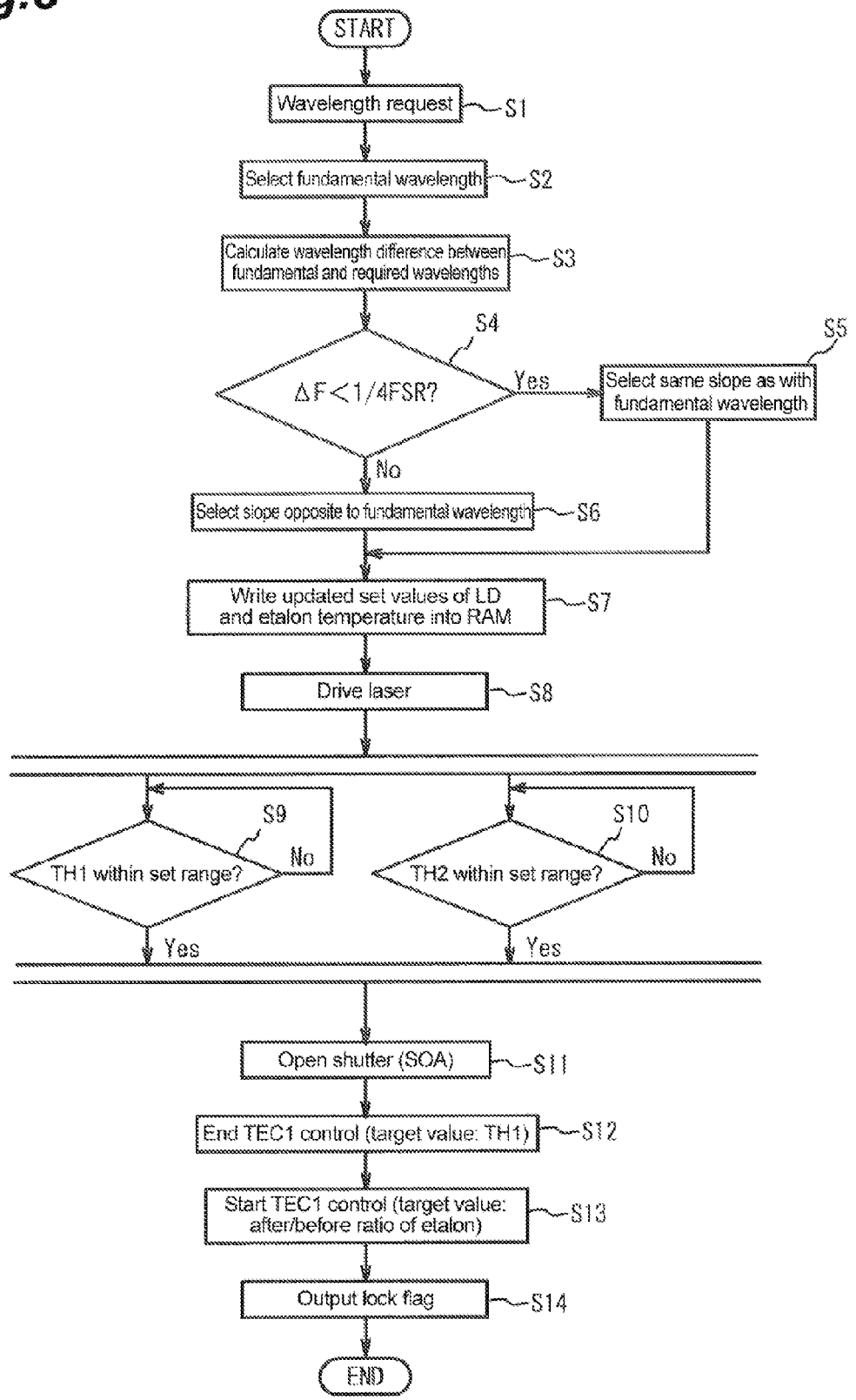
FIG. 8 is a flowchart for explaining a starting procedure for achieving a required wavelength of the semiconductor laser.

FIG. 8 is a flowchart for explaining a starting procedure for achieving the required wavelength of the semiconductor laser 30. As illustrated in FIG. 8, the controller 70 receives a wavelength request F' (step S1). The required wavelength F' is inputted from an external I/O device which is not depicted. Typically, an I/O device corresponding to the RS232C standard is employed. Subsequently, the controller 70 selects the fundamental wavelength F closest to the required wavelength F' (step S2).

Next, the controller 70 calculates the absolute value of the wavelength difference ΔF between the fundamental wavelength F and the required wavelength F' (step S3). Subsequently, the controller 70 determines whether or not the absolute value of the wavelength difference ΔF is less than ¼ of the FSR of the etalon 52 (step S4). When it is determined "Yes" at step S4, the controller 70 selects the same slope as with the fundamental wavelength (step S5). When it is determined "No" at step S4, the controller 70 selects the slope opposite to that of the fundamental wavelength (step S6). In the example of FIG. 4, the required wavelength F' is located on the same slope as with the fundamental wavelength F, whereby |ΔF| is less than ¼ of the FSR. Therefore, the same slope as with the fundamental channel is selected. Here, the operation of selecting the slope will be involved in feedback control for correcting the driving condition of the semiconductor laser 30 in auto frequency control (step S13) to be performed thereafter. That is, the direction of output change in the etalon with respect to the wavelength change is reversed depending on whether the required wavelength F' is located on the same slope as with the fundamental wavelength F or another slope adjacent to the former slope. Hence, while the driving condition of the semiconductor laser 30 is corrected when performing the feedback control, whether or not to reverse the sign of correction is determined according to whether or not the required wavelength F' is on the same slope as with the fundamental wavelength F. This allows the auto frequency control to be performed normally even when the required wavelength F' is located on the slope different from that of the fundamental wavelength F.

After executing step S5 or S6, the controller 70 writes updated set values of the semiconductor laser 30 into the RAM (step S7). The updated set values include a set value which is the wavelength difference ΔF calculated from the initial set value of the fundamental wavelength selected at step S2. At step S7, the controller 70 calculates the set temperature Tetln_A from the wavelength difference ΔF according to the above-mentioned expression (1). The wavelength difference ΔF is determined by ΔF=F'−F and ΔF=F'−(F−FSR/2) when |ΔF| is less than ¼ of the FSR and not, respectively. As the initial temperature Tetln_B, the controller 70 reads the initial temperature value $T_{Etalon}$ corresponding to the fundamental wavelength. It also reads the temperature correction coefficient C1 from the memory 60. According to thus read values and ΔF, the set temperature Tetln_A is calculated. In the example of FIG. 3, the fundamental channel is set as a flag.

Next, according to the updated set values written at step S7, the controller 70 drives the semiconductor laser 30 (step S8). At this point of time, the first temperature control device 31 is controlled such that temperature of the first temperature control device 31 becomes the target temperature $T_{LD}$. The SOA region C is controlled such that the semiconductor laser 30 does not output light at this point of time.

Subsequently, the controller 70 determines whether or not a detected temperature TH1 of the first thermistor 32 falls within a range of $T_{LD}$ (step S9). Here, the range of $T_{LD}$ is a predetermined range centered at the target temperature $T_{LD}$. When it is determined "No" at step S9, the controller 70 changes the current value fed to the first temperature control device 31 such that the detected temperature TH1 of the first thermistor 32 approaches the initial temperature value $T_{LD}$.

In parallel with step S9, the controller 70 determines whether or not a detected temperature TH2 of the second thermistor 55 falls within a set range (step S10). The set range in this case is determined according to the set temperature Tetln_A. For example, the set range may be a predetermined range centered at the set temperature Tetln_A. When it is determined "No" at step S10, the controller 70 changes the current value fed to the second temperature control device 53 such that the detected temperature TH2 of the second thermistor 55 approaches the set temperature Tetln_A.

The controller 70 waits until it is determined "Yes" at both of steps S9 and S10. When it is determined "Yes" at both of steps S9 and S10, the controller 70 performs a shutter opening operation (step S11). Specifically, the current fed to the electrode 21 of the SOA region C is controlled so as to become the initial current value $I_{SOA}$. This causes the semiconductor laser 30 to output laser light having the required wavelength.

Next, the controller 70 stops the first temperature control device 31 from performing the temperature control targeted at $T_{LD}$ (step S12). Subsequently, the controller 70 lets the first temperature control device 31 start the auto frequency control (step S13). That is, the temperature of the first temperature control device 31 is feedback-controlled such as to satisfy the ratio $I_{m2}/I_{m1}$. The ratio between the input light and output light of the etalon 52 (after/before ratio) indicates the oscillation wavelength of the semiconductor laser 30. The first temperature control device 31 is a parameter for controlling the wavelength of the semiconductor laser 30. That is, at step S10, the temperature of the first temperature control device 31 is feedback-controlled such that the after/before ratio becomes $I_{m2}/I_{m1}$, so as to control the wavelength of the semiconductor laser 30. When a flag indicating the middle wavelength is set, the slope on the opposite side of the fundamental wavelength is used. When the slope on the opposite side is used, the sign employed for correcting the driving condition of the semiconductor laser 30 in the auto frequency control (feedback control) is opposite to that in the case of using the same slope as with the fundamental wavelength. The current value fed to the first temperature control device 31 is controlled at predetermined step values (fixed values). The controller 70 generates temperature control signs for making the ratio $I_{m2}/I_{m1}$ closer to the target value $I_{m2}/I_{m1}$. The temperature control signs include respective signs for temperature to increase and decrease and a sign indicating that no temperature change is necessary. According to such a sign, the current value fed to the first temperature control device 31 is controlled so as to increase or decrease by the step values. When the ratio $I_{m2}/I_{m1}$ shifts into a predetermined range with respect to the target value $I_{m2}/I_{m1}$, the controller 70 outputs the sign indicating that no temperature control is necessary, whereby the amount of current is not changed in the first temperature control device 31. Since the temperature of the etalon 52 is changed to the value calculated at step S4 as mentioned above, the feedback control using the ratio $I_{m2}/I_{m1}$ at the fundamental wavelength as the feedback target value makes the oscillation wavelength of the semiconductor laser 30 become the required wavelength instead of the fundamental wavelength.

When the ratio $I_{m2}/I_{m1}$ is seen to fall within a predetermined range centered at the target value $I_{m2}/I_{m1}$ at the fundamental wavelength selected at step S2, the controller 70 outputs a lock flag (step S14).

While a solid etalon is used as the etalon 52 in this embodiment, other etalons may also be used. For example, a liquid crystal etalon in which a liquid crystal layer is interposed between mirrors may be used as the etalon 52. In this case, controlling the voltage applied to the liquid crystal can shift the wavelength characteristic of the liquid crystal etalon. Also employable as the etalon 52 is an air-gap etalon which can change the gap length between its mirrors according to the voltage applied thereto. In this case, controlling the applied voltage can shift the wavelength characteristic of the air-gap etalon. The second temperature control device 53 controls the temperature of any of the liquid crystal etalon and air-gap etalon. However, the temperature control in this case is not for shifting the wavelength characteristic but for preventing the wavelength characteristic from fluctuating because of the temperature. Hence, the temperature is controlled so as to become constant.

When the required wavelength is located on the same slope as with the fundamental wavelength, this embodiment performs the wavelength control by using a slope having the same gradient as with the fundamental wavelength. When the required wavelength is located on a slope different from that of the fundamental wavelength, on the other hand, the wavelength control is performed with a slope having a gradient which is the reverse of the slope of the fundamental wavelength. This makes it unnecessary for the memory 60 to store the initial set values corresponding to the middle wavelengths and the like. As a result, the memory 60 can be restrained from increasing its capacity. Since no tests for middle wavelengths are necessary, the test time can be made shorter.

Modified Example

The above-mentioned embodiment selects the slope. Selecting the slope is equivalent to selecting the sign for correcting the driving condition of the semiconductor laser 30 by feedback control in the auto frequency control. Hence, whether or not to reverse the sign for correcting the driving condition of the semiconductor laser 30 may be determined without selecting the slope.

Figure 9:
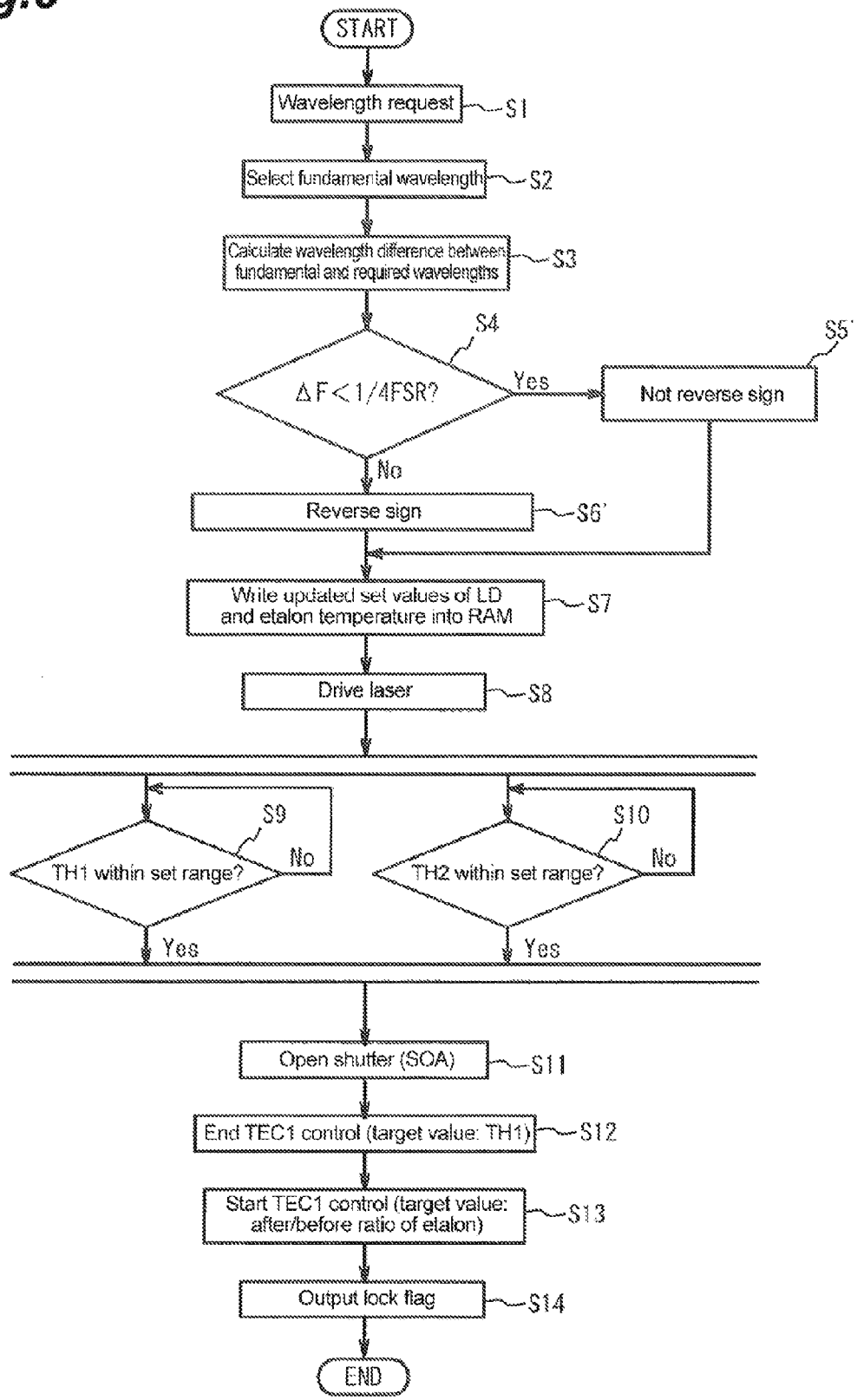
FIG. 9 is a flowchart for explaining a starting procedure for achieving a required wavelength of the semiconductor laser.

FIG. 9 is a flowchart illustrating another example of the starting procedure for achieving the required wavelength of the semiconductor laser 30. Differences from the flowchart of FIG. 8 will be explained. When it is determined "Yes" at step S4, the controller 70 does not reverse the sign concerning the correction of the semiconductor laser 30 in the feedback control at step S13 (step S5'). Specifically, the controller 70 sets the fundamental wavelength flag. When it is determined "No" at step S4, the controller 70 reverses the sign concerning the correction of the semiconductor laser 30 in the feedback control at step S13 (step S6'). Specifically, the controller 70 sets the middle wavelength flag.

At step S13, the controller 70 performs feedback control such that the temperature of the first temperature control device 31 satisfies the ratio $I_{m2}/I_{m1}$. When the fundamental wavelength flag is set, the controller 70 performs the feedback control corresponding to the slope of the fundamental wavelength. When the middle wavelength flag is set, the controller 70 reverses the sign concerning the correction of the driving condition of the semiconductor laser and performs feedback control.

This modified example can perform wavelength control according to the fundamental and middle wavelengths by only reversing the sign concerning the correction of the driving condition of the semiconductor laser 30 and not. This makes it unnecessary for the memory 60 to store the initial set values corresponding to the middle wavelengths and the like. As a result, the memory 60 can be restrained from increasing its capacity. Since no tests for middle wavelengths are necessary, the test time can be made shorter.

Second Embodiment

Figure 10:
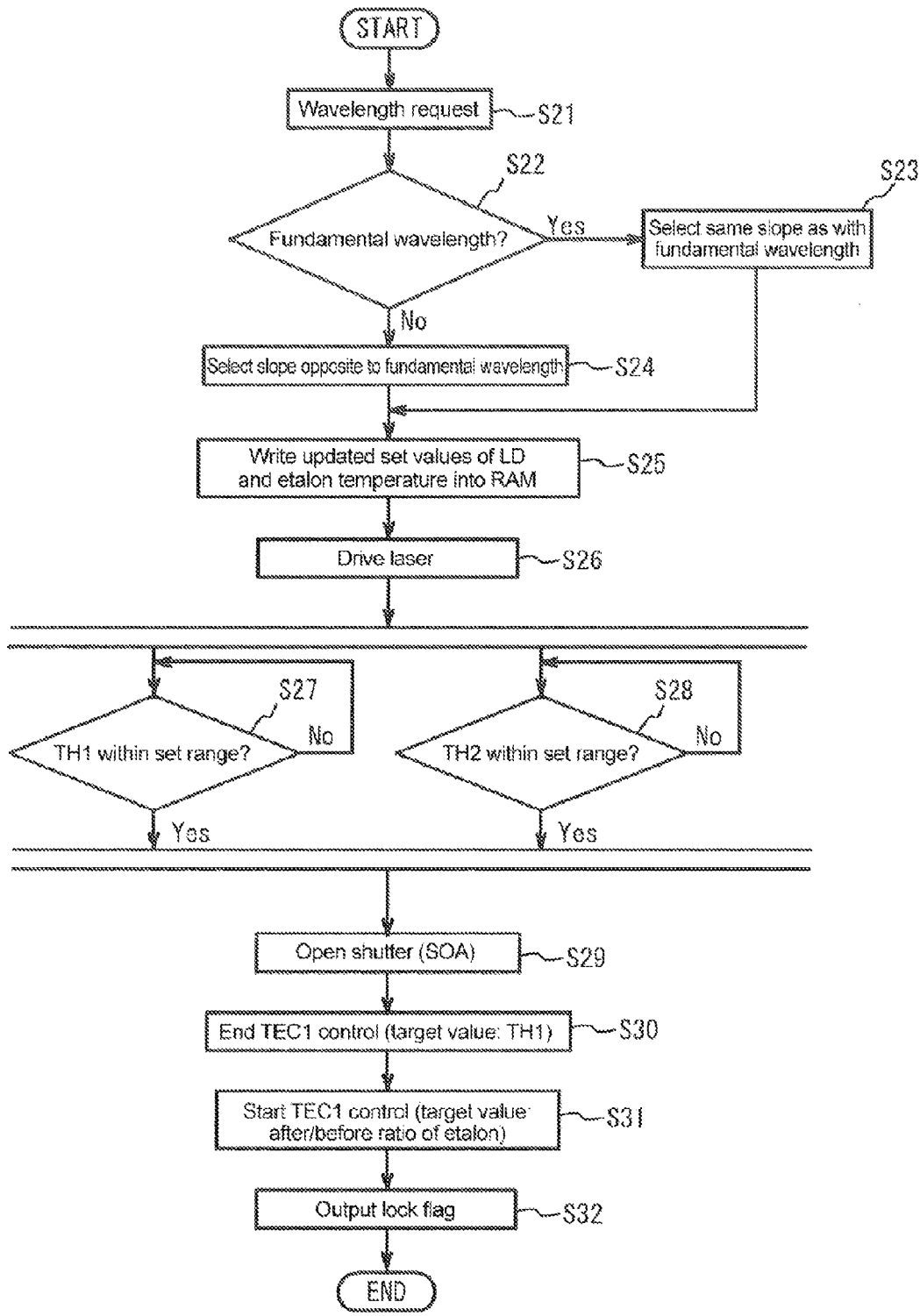
FIG. 10 is a flowchart for explaining a starting procedure for achieving a required wavelength of the semiconductor laser.

While the first embodiment explains arbitrarily set wavelength control (gridless control), the present invention is also applicable to grid control with fixed wavelengths. FIG. 10 is a flowchart for explaining a starting procedure for achieving a required wavelength (a given grid wavelength) of the semiconductor laser 30. As illustrated in FIG. 10, the controller 70 receives a wavelength request F' (step S21). The required wavelength F' is inputted from an external I/O device which is not depicted. Typically, an I/O device corresponding to the RS232C standard is employed. Subsequently, the controller 70 determines whether or not the required wavelength F' is any of fundamental wavelengths F (step S22).

When it is determined "Yes" at step S22, the controller 70 selects the same slope as with the fundamental wavelength (step S23). When it is determined "No" at step S22, the controller 70 selects the slope opposite to the fundamental wavelength (step S24). After executing step S23 or S24, the controller 70 writes updated set values of the semiconductor laser 30 into the RAM (step S25). When the required wavelength is the fundamental wavelength, the updated set values include the initial set values of the fundamental wavelength and the feedback control target values. When the required wavelength is a middle wavelength, the updated set values include a flag concerning the slope selected at step S24 in addition to the initial set values of any fundamental wavelength adjacent to the middle wavelength and the feedback control target values.

Next, according to the updated set values written at step S25, the controller 70 drives the semiconductor laser 30 (step S26). Subsequently, the controller 70 determines whether or not the detected temperature TH1 of the first thermistor 32 falls within a range of $T_{LD}$ (step S27). Here, the range of $T_{LD}$ is a predetermined range centered at the target temperature $T_{LD}$. When it is determined "No" at step S27, the controller 70 changes the current value fed to the first temperature control device 31 such that the detected temperature TH1 of the first thermistor 32 approaches the initial temperature value $T_{LD}$.

In parallel with step S27, the controller 70 determines whether or not the detected temperature TH2 of the second thermistor 55 falls within the set range (step S28). The set range in this case is determined according to the set temperature Tetln_A. The above-mentioned set range may be a predetermined range centered at the set temperature Tetln_A, for example. When it is determined "No" at step S28, the controller 70 changes the current value fed to the second temperature control device 53 such that the detected temperature TH2 of the second thermistor 55 approaches the set temperature Tetln_A.

The controller 70 waits until it is determined "Yes" at both of steps S27 and S28. When it is determined "Yes" at both of steps S27 and S28, the controller 70 performs a shutter opening operation (step S29). Specifically, the current fed to the electrode 21 of the SOA region C is controlled so as to become the initial current value $I_{SOA}$. This causes the semiconductor laser 30 to output laser light having the required wavelength.

Next, the controller 70 stops the first temperature control device 31 from terminating the temperature control targeted at $T_{LD}$ (step S30). Subsequently, the controller 70 lets the first temperature control device 31 start the auto frequency control (step S31). That is, the temperature of the first temperature control device 31 is feedback-controlled such as to satisfy the ratio $I_{m2}/I_{m1}$. The ratio between the input light and output light of the etalon 52 (after/before ratio) indicates the oscillation wavelength of the semiconductor laser 30. The first temperature control device 31 is a parameter for controlling the wavelength of the semiconductor laser 30. That is, at step S31, the temperature of the first temperature control device 31 is feedback-controlled such that the after/before ratio becomes $I_{m2}/I_{m1}$, so as to control the wavelength of the semiconductor laser 30. When a flag indicating the middle wavelength is set, the slope on the opposite side of the fundamental wavelength is used. The current value fed to the first temperature control device 31 is controlled at predetermined step values (fixed values). The controller 70 generates temperature control signs for making the ratio $I_{m2}/I_{m1}$ closer to the target value $I_{m2}/I_{m1}$. The temperature control signs include respective signs for temperature to increase and decrease and a sign indicating that no temperature change is necessary. According to such a sign, the current value fed to the first temperature control device 31 is controlled so as to increase or decrease by the step values. When the ratio $I_{m2}/I_{m1}$ shifts into a predetermined range with respect to the target value $I_{m2}/I_{m1}$, the controller 70 outputs the sign indicating that no temperature control is necessary, whereby the amount of current is not changed in the first temperature control device 31.

When the ratio $I_{m2}/I_{m1}$ is seen to fall within a predetermined range centered at the target value $I_{m2}/I_{m1}$ at the fundamental wavelength selected at step S22, the controller 70 outputs a lock flag (step S32).

When the required wavelength is located on the same slope as with the fundamental wavelength, this embodiment performs the wavelength control by using the slope having the same gradient as with the fundamental wavelength. When the required wavelength is located on a slope different from that of the fundamental wavelength, on the other hand, the wavelength control is performed with a slope having a gradient which is the reverse of the slope of the fundamental wavelength. This makes it unnecessary for the memory 60 to store the initial set values corresponding to the middle wavelengths and the like. As a result, the memory 60 can be restrained from increasing its capacity. Since no tests for middle wavelengths are necessary, the test time can be made shorter.

Modified Example

The above-mentioned embodiment selects the slope. Selecting the slope is equivalent to selecting the sign for correcting the driving condition of the semiconductor laser 30 by feedback control in the auto frequency control. Hence, whether or not to reverse the sign for correcting the driving condition of the semiconductor laser 30 may be determined without selecting the slope.

Figure 11:
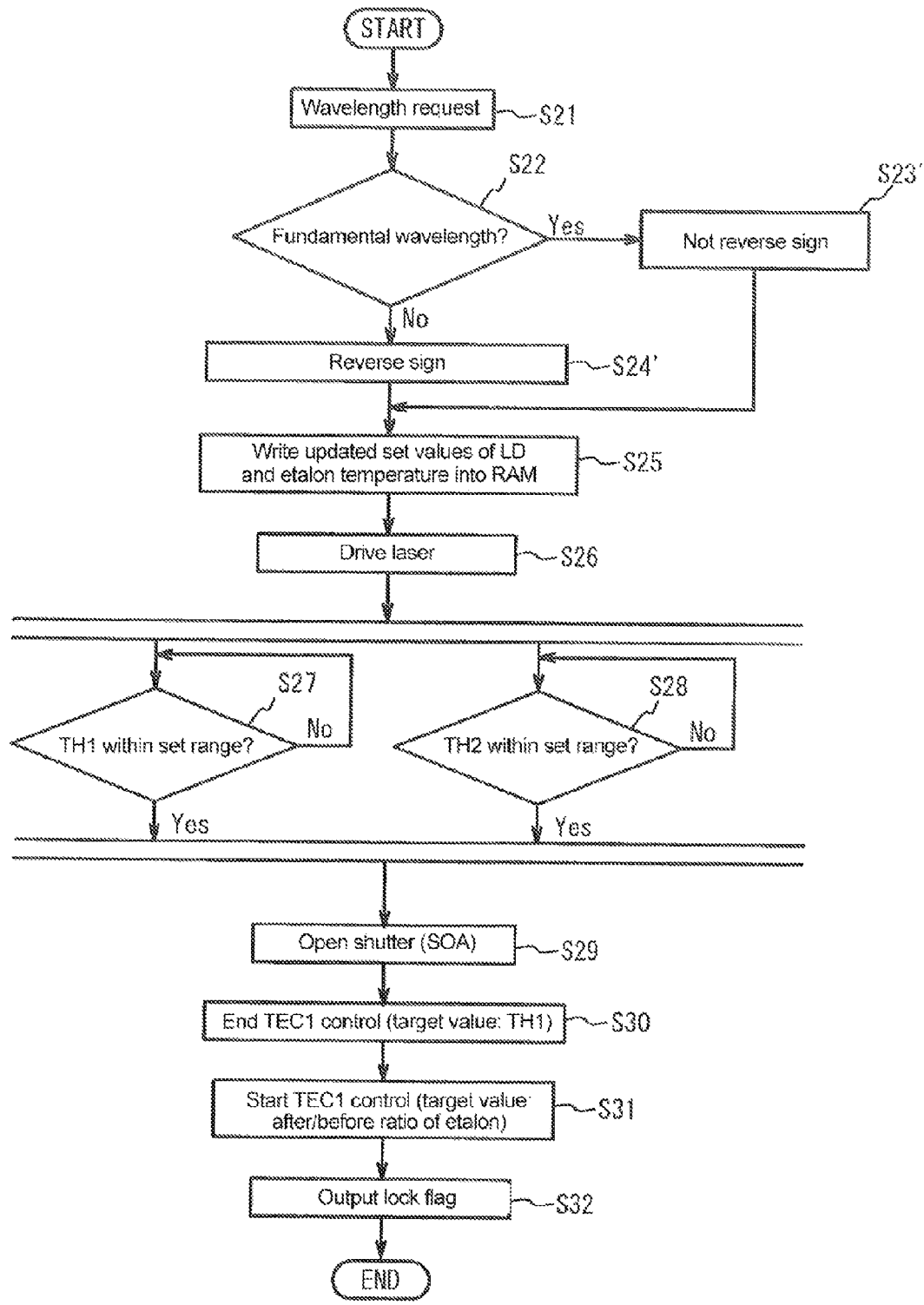
FIG. 11 is a flowchart for explaining a starting procedure for achieving a required wavelength of the semiconductor laser.

FIG. 11 is a flowchart illustrating another example of the starting procedure for achieving the required wavelength of the semiconductor laser 30. Differences from the flowchart of FIG. 10 will be explained. When it is determined "Yes" at step S22, the controller 70 does not reverse the sign concerning the correction of the semiconductor laser 30 in the feedback control at step S31 (step S23'). Specifically, the controller 70 sets the fundamental wavelength flag. When it is determined "No" at step S22, the controller 70 reverses the sign concerning the correction of the semiconductor laser 30 in the feedback control at step S31 (step S24'). Specifically, the controller 70 sets the middle wavelength flag.

At step S31, the controller 70 performs feedback control such that the temperature of the first temperature control device 31 satisfies the ratio $I_{m2}/I_{m1}$. When the fundamental wavelength flag is set, the controller 70 performs the feedback control corresponding to the slope of the fundamental wavelength. When the middle wavelength flag is set, the controller 70 reverses the sign concerning the correction of the driving condition of the semiconductor laser and performs feedback control.

This modified example can perform wavelength control according to the fundamental and middle wavelengths by only reversing the sign concerning the correction of the driving condition of the semiconductor laser 30 and not. This makes it unnecessary for the memory 60 to store the initial set values corresponding to the middle wavelengths and the like. As a result, the memory 60 can be restrained from increasing its capacity. Since no tests for middle wavelengths are necessary, the test time can be made shorter.

While embodiments of the present invention are explained in detail in the foregoing, the present invention is not limited to such specific embodiments but may be modified and changed in various manners within the scope of the gist of the present invention set forth in the claims.

What is claimed is:

1. A method for controlling a wavelength-tunable laser comprising a wavelength detection unit having an etalon, the method comprising:
   a first step of acquiring from a memory a first driving condition for laser-oscillating the wavelength-tunable laser at a first wavelength;
   a second step of computing a second driving condition for oscillating the wavelength-tunable laser at a second wavelength with reference to the first driving condition and a wavelength difference between the first and second wavelengths; and
   a third step of detecting with the wavelength detection unit an output wavelength of the wavelength-tunable laser driven according to the second driving condition and performing according to a result thereof feedback control for correcting the driving conditions of the wavelength-tunable laser;
   the method further comprising a step, before the third step, of determining whether or not to reverse a correction sign for the correction in the feedback control with respect to a correction sign in the first driving condition.

2. The method for controlling a wavelength-tunable laser according to claim 1, wherein the correction sign is reversed and not when the wavelength difference is at least a quarter of an FSR of the etalon and not, respectively.

3. The method for controlling a wavelength-tunable laser according to claim 2, wherein the wavelength difference is determined by the following expressions (1) and (2) when smaller than a quarter of the FSR of the etalon and not, respectively:

$$\Delta F = F' - F \quad (1)$$

$$\Delta F = F' - (F - FSR/2) \quad (2)$$

where F is a fundamental channel, F' is a required wavelength, and $\Delta F$ is the wavelength difference.

* * * * *